US010026710B2

(12) United States Patent
Bemmerl et al.

(10) Patent No.: US 10,026,710 B2
(45) Date of Patent: Jul. 17, 2018

(54) ELECTRONIC ARRANGEMENT

(71) Applicant: OSRAM OPTO SEMICONDUCTORS GMBH, Regensburg (DE)

(72) Inventors: Thomas Bemmerl, Schwandorf (DE); Simon Jerebic, Tegernheim (DE); Markus Pindl, Tegernheim (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/589,427

(22) Filed: May 8, 2017

(65) Prior Publication Data

US 2017/0243850 A1 Aug. 24, 2017

Related U.S. Application Data

(63) Continuation of application No. 13/700,414, filed as application No. PCT/EP2011/055769 on Apr. 13, 2011, now Pat. No. 9,681,566.

(30) Foreign Application Priority Data

May 27, 2010 (DE) .......................... 10 2010 029 368

(51) Int. Cl.
*H05K 7/00* (2006.01)
*H01L 23/00* (2006.01)
(Continued)

(52) U.S. Cl.
CPC .............. *H01L 24/32* (2013.01); *H01L 21/56* (2013.01); *H01L 23/3142* (2013.01);
(Continued)

(58) Field of Classification Search
CPC ...... H05K 3/284; H05K 3/303; H05K 3/3442; H05K 3/0023; H01L 23/3121
(Continued)

(56) References Cited

U.S. PATENT DOCUMENTS 5,315,070 A * 5/1994 Maiwald ................ H05K 3/303
174/250
5,811,736 A * 9/1998 Lauffer ................ H05K 3/0023
174/263

(Continued)

FOREIGN PATENT DOCUMENTS

CN 1472809 2/2004
DE 10 2006 046678 4/2008
(Continued)

*Primary Examiner* — Tuan T Dinh
(74) *Attorney, Agent, or Firm* — Cozen O'Connor

(57) ABSTRACT

An electronic arrangement comprising: a carrier; at least one connecting area on the carrier; at least one electronic component, which is fixed at least on the connecting area by a contact material; a covering area, which surrounds the connecting area on the carrier; and at least one covered region covered by a covering material; wherein the covering area is highly reflective with a reflectivity of greater than 70%, exposed regions on the connecting area and on the contact material are covered with the covering material, and the covering material is colored by titanium dioxide particles in such a way that the titanium dioxide particles are provided in the covering material in a proportion between 25 percent and 70 percent by weight, such that the covering material is highly reflective with a reflectivity of greater than 70% to minimize optical contrast between the covering area and the covered region.

20 Claims, 13 Drawing Sheets

(51) Int. Cl.
*H01L 33/62* (2010.01)
*H01L 33/54* (2010.01)
*H01L 33/60* (2010.01)
*H01L 33/50* (2010.01)
*H01L 33/56* (2010.01)
*H01L 33/32* (2010.01)
*H01L 33/06* (2010.01)
*H01L 23/31* (2006.01)
*H01L 21/56* (2006.01)
*H01L 25/16* (2006.01)

(52) U.S. Cl.
CPC ............ *H01L 24/83* (2013.01); *H01L 25/167* (2013.01); *H01L 33/06* (2013.01); *H01L 33/32* (2013.01); *H01L 33/507* (2013.01); *H01L 33/54* (2013.01); *H01L 33/56* (2013.01); *H01L 33/60* (2013.01); *H01L 33/62* (2013.01); *H01L 2224/32225* (2013.01); *H01L 2224/48091* (2013.01); *H01L 2224/48227* (2013.01); *H01L 2224/73265* (2013.01); *H01L 2924/12041* (2013.01); *H01L 2924/1434* (2013.01); *H01L 2924/19041* (2013.01); *H01L 2924/19042* (2013.01); *H01L 2924/19043* (2013.01); *H01L 2933/005* (2013.01); *H01L 2933/0066* (2013.01)

(58) Field of Classification Search
USPC .......... 361/760–764, 772–784; 174/250–261
See application file for complete search history.

(56) References Cited

U.S. PATENT DOCUMENTS

| | | | |
|---|---|---|---|
| 6,521,997 B1 * | 2/2003 | Huang | H01L 23/3121 174/255 |
| 6,570,259 B2 * | 5/2003 | Alcoe | H01L 21/563 174/539 |
| 6,747,293 B2 | 6/2004 | Nitta et al. | |
| 7,268,437 B2 * | 9/2007 | Liu | H01L 23/3121 174/250 |
| 7,334,907 B2 | 2/2008 | Nagayama | |
| 7,382,628 B2 * | 6/2008 | Kawamoto | H05K 3/284 174/257 |
| 8,716,741 B2 * | 5/2014 | Kashimura | H05K 3/3442 257/100 |
| 9,287,476 B2 | 3/2016 | Ichikawa et al. | |
| 2002/0154366 A1 | 10/2002 | Horio | |
| 2004/0036078 A1 | 2/2004 | Kondo | |
| 2004/0217369 A1 | 11/2004 | Nitta et al. | |
| 2006/0076666 A1 | 4/2006 | Lee et al. | |
| 2007/0045800 A1 | 3/2007 | King et al. | |
| 2008/0023711 A1 | 1/2008 | Tarsa et al. | |
| 2008/0149962 A1 | 6/2008 | Kim et al. | |
| 2009/0114929 A1 | 5/2009 | Lee et al. | |
| 2009/0114938 A1 | 5/2009 | Hsu et al. | |
| 2009/0141505 A1 | 6/2009 | Ushiki et al. | |
| 2009/0283781 A1 | 11/2009 | Chan | |

FOREIGN PATENT DOCUMENTS

| | | |
|---|---|---|
| DE | 10 2007 060206 | 6/2009 |
| DE | 10 2010 021011 | 11/2011 |
| EP | 0 308 676 | 8/1988 |
| EP | 1 249 874 | 10/2002 |
| EP | 1 768 182 | 9/2006 |
| EP | 2 144 305 | 1/2010 |
| EP | 2 325 901 | 5/2011 |
| JP | 55-34496 | 3/1980 |
| JP | 2000-022221 | 1/2000 |
| JP | 2002-124703 | 4/2002 |
| JP | 2002-314143 | 10/2002 |
| JP | 2003-282950 | 10/2003 |
| JP | 2004-023058 | 1/2004 |
| JP | 2005-277227 | 10/2005 |
| JP | 2006-120748 | 5/2006 |
| JP | 2007-243226 | 9/2007 |
| JP | 2007-281323 | 10/2007 |
| JP | 2007-294506 | 11/2007 |
| JP | 2007-294700 | 11/2007 |
| JP | 2008-258296 | 10/2008 |
| JP | 2009-040884 | 2/2009 |
| JP | 2009-117825 | 5/2009 |
| JP | 2009-130234 | 6/2009 |
| JP | 2009-149879 | 7/2009 |
| JP | 2009-194026 | 8/2009 |
| JP | 2009-252899 | 10/2009 |
| JP | 2009-295892 | 12/2009 |
| JP | 2010-062272 | 3/2010 |
| JP | 2010-100827 | 5/2010 |
| JP | 2010-114144 | 5/2010 |
| JP | 2011-503817 | 1/2011 |
| JP | 2012-503876 | 2/2012 |
| WO | WO 2009/038072 | 3/2009 |
| WO | WO 2009/066026 | 5/2009 |
| WO | WO 2009/066206 | 5/2009 |
| WO | WO 2009/075530 | 6/2009 |
| WO | WO 2010/035206 | 4/2010 |
| WO | WO 2010/051758 | 5/2010 |

\* cited by examiner

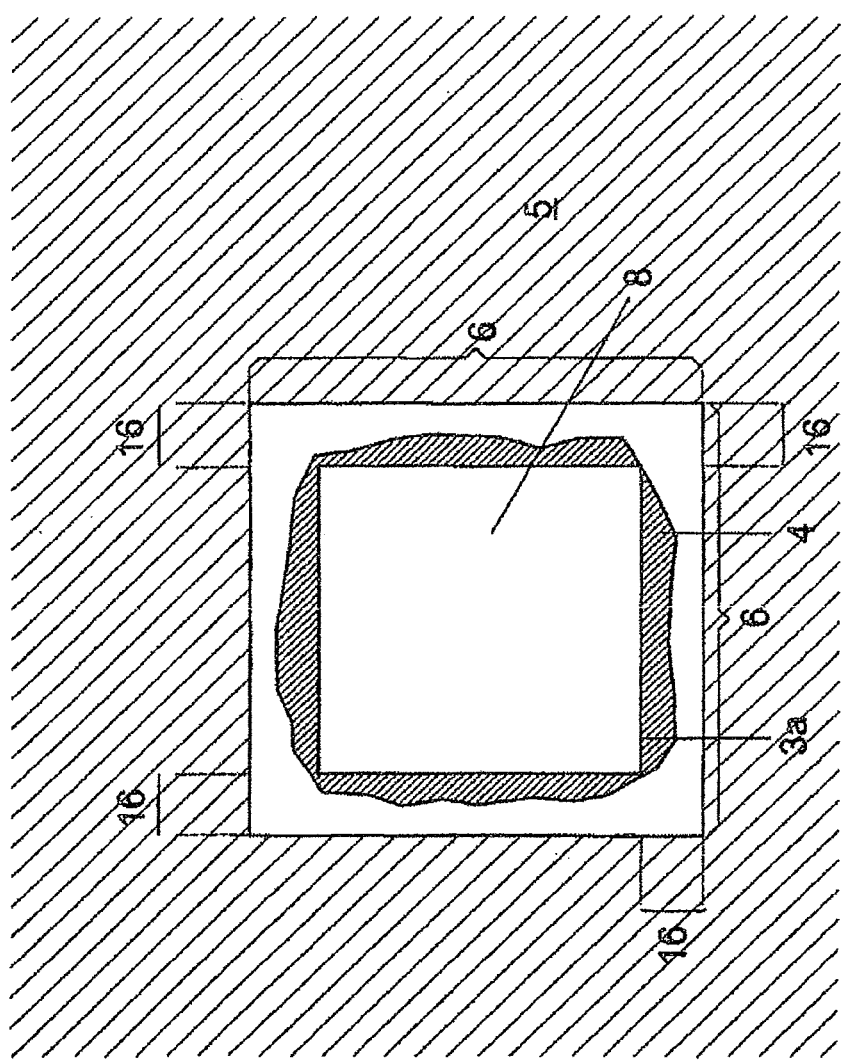

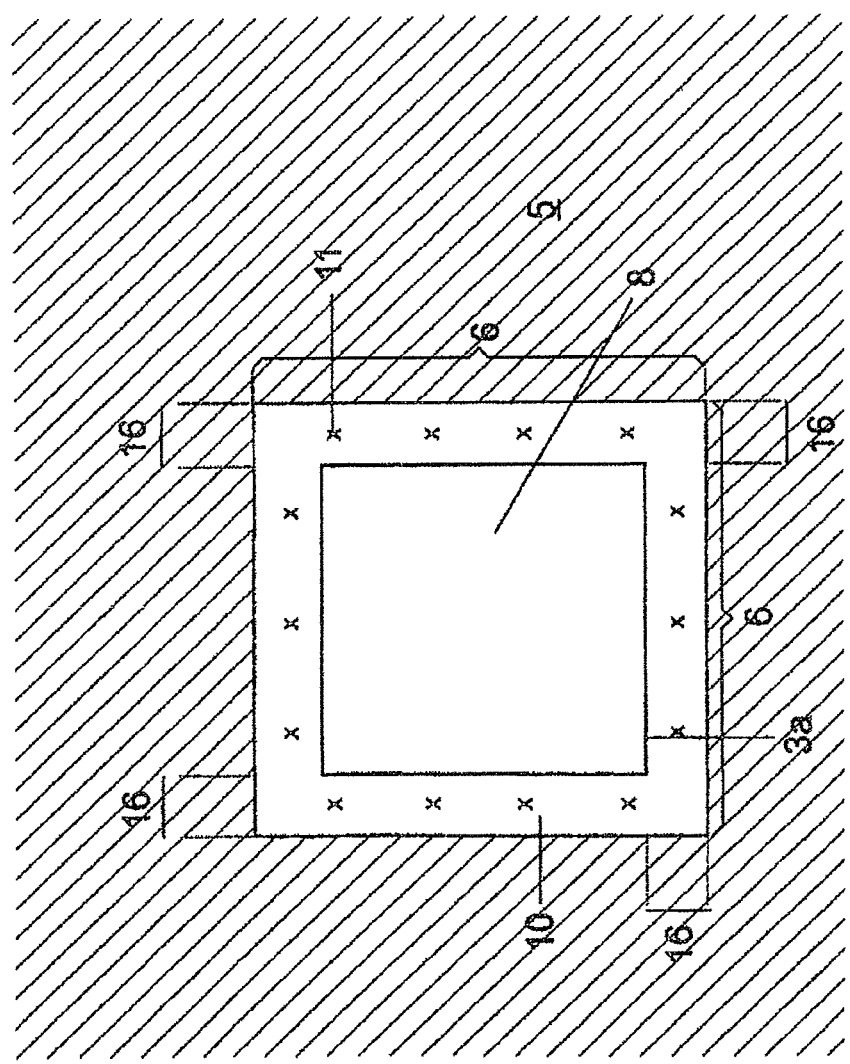

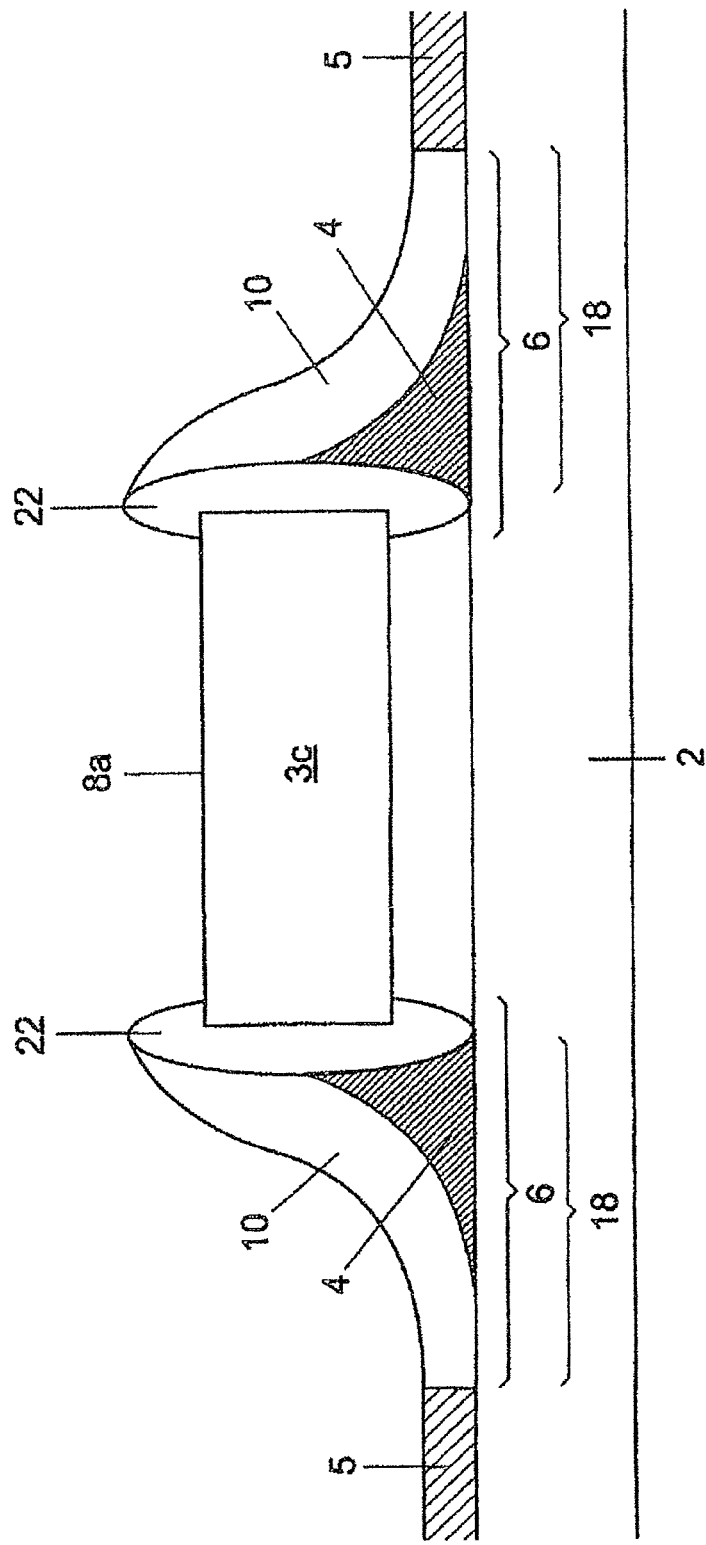

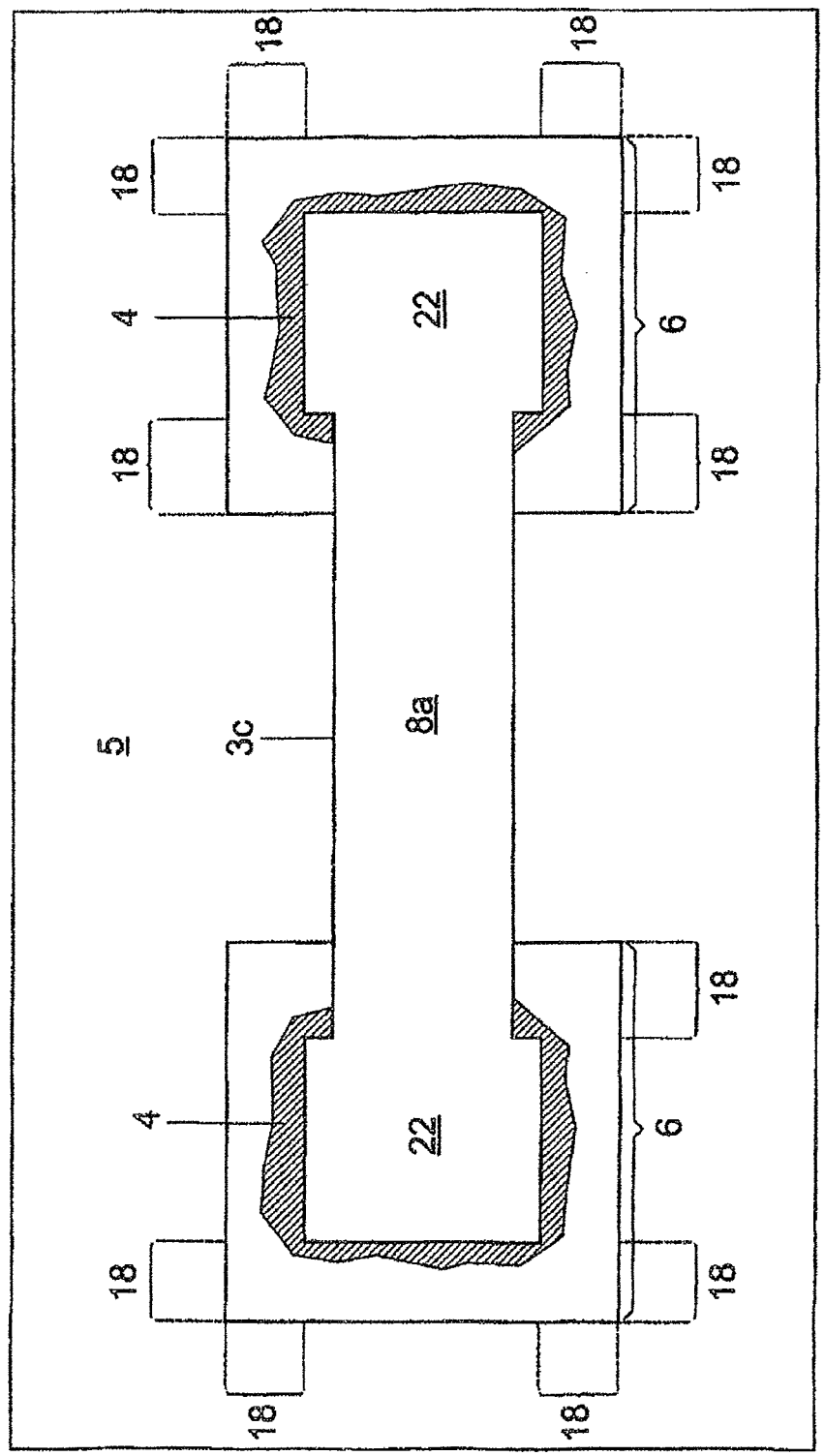

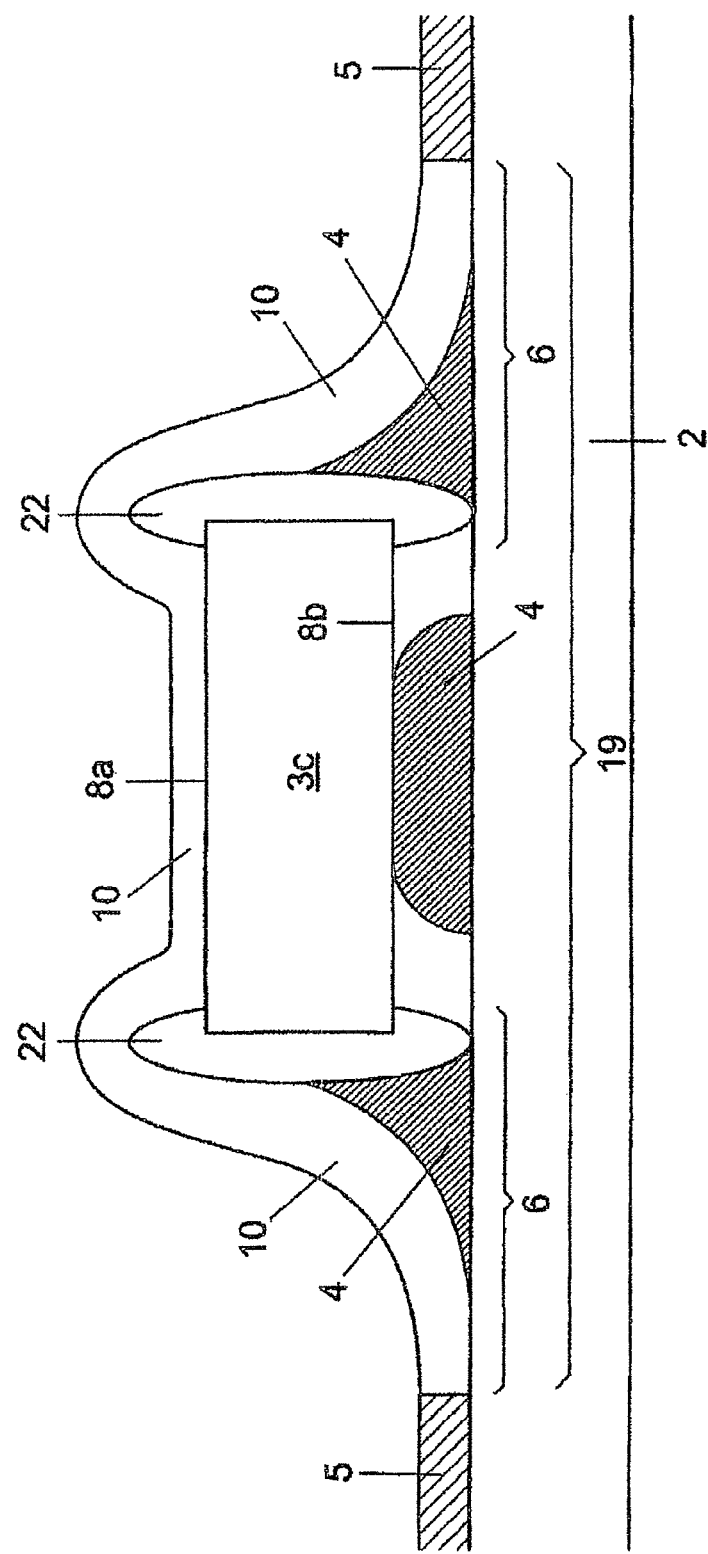

ELECTRONIC ARRANGEMENT

CROSS REFERENCE TO RELATED APPLICATIONS

This application is a continuation of U.S. application Ser. No. 13/700,414 filed Nov. 27, 2012 which claims the priority under 35 U.S.C. 371 of International application No. PCT/EP2011/055769 filed on Apr. 13, 2011. Priority is also claimed of German application no. 10 2010 029 368.7 filed on May 27, 2010. The entire contents of all these applications is hereby incorporated by reference.

BACKGROUND OF THE INVENTION

The present invention relates to an electronic arrangement and to a method for producing an electronic arrangement.

Electronic arrangements have an inhomogeneous optical appearance in the switched-off state. They can comprise optoelectronic components and non-optoelectronic components, the contact materials and surfaces of which can give different color and brightness impressions.

SUMMARY OF THE INVENTION

One object of the invention is to provide an electronic arrangement which has a homogeneous optical appearance in the switched-off state.

Various embodiments comprise an electronic arrangement comprising optoelectronic and non-optoelectronic components. The optical appearance is homogenized in the switched-off state.

The absorption losses are minimized in the switched-on state of the optoelectronic component.

The electronic arrangement comprises a carrier with at least one connecting area. At least one electronic component is fixed on the connecting area by means of a contact material. A covering area is arranged on the carrier and surrounds the connecting area. The electronic arrangement comprises at least one covered region covered by a covering material. The covering material is designed in such a way that an optical contrast between the covering area and the covered region is minimized.

In one preferred embodiment, the connecting area is an electrical, preferably metallic, contact-making area.

Alternatively or supplementarily, the connecting area is an, in particular non-metallic, adhesive-bonding area. This can be applied in the case of optoelectronic components grown on sapphire.

The optical contrast relates to a color contrast. Alternatively, or supplementarily, the optical contrast also relates to a brightness contrast. The optical contrast is minimized firstly by virtue of the fact that the covering area and the covering material have a similar, preferably an identical, reflectivity. Secondly, the optical contrast is minimized by virtue of the fact that the covering area and the covering material have a similar, preferably an identical, color.

Color locus differences and thus the color contrast can be represented by the color difference $\Delta E$. The term "identical color stimulus specification" can be used synonymously with "identical color valence". Color differences $\Delta E<2$ are virtually imperceptible to the human eye. In contrast thereto, color difference of $\Delta E>5\text{-}10$ are perceived as different colors. The color of the covering area and the color of the covering material preferably have a color difference of $\Delta E<5$, particularly preferably of $\Delta E<3$.

The similarity of the brightness impression of covering material with respect to covering area can be expressed in differences in reflectance. Before the covering, e.g. the gold-covered bonding pad has a reflectance of approximately 55%. The material of the covering area can have a reflectance of approximately 95%. The 40% difference thus defined can be defined as the disturbing initial state. The difference between the reflectivity of the covering area and the reflectivity of the covering material is preferably less than 20% and particularly preferably less than 10%. Each reduction in the difference between the reflectivities of covering area and covering material produces a more homogeneous brightness impression.

Besides minimizing contrast, the partial or complete covering of electronic components with covering material leads to corrosion protection for the electronic components.

The use of covering material is advantageous in comparison with the use of lenses composed of diffuse plastic or the roughening of lens surfaces or the coating of the lens surface with diffuse resin.

In one preferred embodiment, the contact material comprises solder or adhesive. This is advantageous since the electronic component can thereby be mechanically and/or electrically conductively connected to the connecting area.

In one preferred embodiment, the electronic component can be an optoelectronic component, in particular an LED. The optoelectronic component can be grown on a III-V compound semiconductor material, in particular a nitride compound semiconductor material such as gallium nitride (GaN). The optoelectronic component comprises at least one active zone that emits electromagnetic radiation. The active zones can be pn-junctions, a double heterostructure, a multiple quantum well structure (MQW), a single quantum well structure (SQW). Quantum well structure means: quantum wells (3-dim), quantum wires (2-dim) and quantum dots (1-dim).

In one preferred embodiment, the electronic component can be a non-optoelectronic component. An ESD semiconductor chip and/or a microchip, for example a memory or a controller, can be used as non-optoelectronic component. Alternatively or supplementarily, a passive component, in particular a resistor, a coil or a capacitor, can be used as non-optoelectronic component.

In one preferred embodiment, the optoelectronic component is a semiconductor chip with wire contact connections. Alternatively or supplementarily, the optoelectronic component can be configured as a flip-chip. The embodiment comprising an optoelectronic component in the form of a flip-chip is advantageous since the shading by the bonding wire is obviated and no active area is lost by virtue of the bonding pad on the optoelectronic component.

In one preferred embodiment, the region covered by the covering material comprises the area of the non-optoelectronic component which faces away from the carrier.

In one preferred embodiment, the covered region comprises the side areas of the electronic component.

In one preferred embodiment, the covered region comprises the regions of the connecting area which are not covered by the electrical component.

In one preferred embodiment, the covered region comprises the regions of the contact material which are not covered by the electrical component.

In one preferred embodiment, the bonding wires can be covered by the covering material.

In one preferred embodiment, fixing units, in particular screws can be covered by the covering material.

In one preferred embodiment, the non-optoelectronic components can be completely covered by a covering material. The complete covering of the non-optoelectronic components is particularly advantageous since the contrast between covered component and covering area is thus minimized, preferably disappears.

The covered regions are advantageous since the optical appearance of the electronic arrangement in the switched-off state is homogenized by the covering. Moreover, it is advantageous that the light absorption at poorly reflective surfaces of the electronic arrangement is reduced.

In one preferred embodiment, the covering area comprises a ceramic, preferably white, material. Alternatively, or supplementarily thereto, the covering area comprises a laminated epoxy resin. Alternatively or supplementarily thereto, the covering area comprises soldering resist.

In one preferred embodiment, the covering material comprises a colored silicone. Alternatively or supplementarily thereto, the covering material comprises a colored epoxy resin, in particular soldering resist. Alternatively or supplementarily thereto, the covering material comprises a thermoplastic.

In one preferred embodiment, the covering material is colored by pigments, in particular by titanium dioxide ($TiO_2$) particles.

In one preferred embodiment, titanium dioxide particles are provided in the covering material in a proportion of up to 70 percent by weight, preferably of approximately 25 percent by weight.

In one preferred embodiment, the covering area is highly reflective with a reflectivity of greater than 70%. Alternatively or supplementarily thereto, the covering material is highly reflective with a reflectivity of greater than 70%.

Various embodiments comprise a method for producing an electronic arrangement. In one preferred embodiment, a covering area is applied to a carrier areally and in a structured fashion. In this case, the at least one connecting area is omitted. Afterward, at least one electronic component is mounted on the connecting area. Afterward, at least partly exposed regions on the connecting area are covered.

Alternatively or supplementarily, in the case of a non-optoelectronic component, the area of the electronic component which faces away from the carrier is covered with covering material.

In one preferred embodiment, covering with a covering material is effected by dispensing or metering.

In one preferred embodiment, covering with a covering material is effected by jetting.

BRIEF DESCRIPTION OF THE DRAWINGS

Various exemplary embodiments of the solution according to the invention are explained in greater detail below with reference to the drawings.

FIGS. 3a and 3b show plan views of an excerpt from an electronic arrangement comprising an optoelectronic component with flip-chip contact-making;

FIG. 6a shows in sectional view an excerpt from an electronic arrangement comprising a non-optoelectronic component, in particular a passive component;

FIGS. 6b and 6c show in plan view an excerpt from an electronic arrangement comprising a non-optoelectronic component, in particular a passive component;

FIG. 7a shows in sectional view an excerpt from an electronic arrangement comprising a non-optoelectronic component, in particular a passive component;

DETAILED DESCRIPTION OF THE DRAWINGS

Elements which are identical, of identical type or act identically are provided with the same reference signs in the figures. The figures and the size relationships of the elements illustrated in the figures among one another should not be regarded as to scale. Rather, individual elements may be illustrated with an exaggerated size in order to enable better illustration and in order to afford a better understanding.

Figure 1:
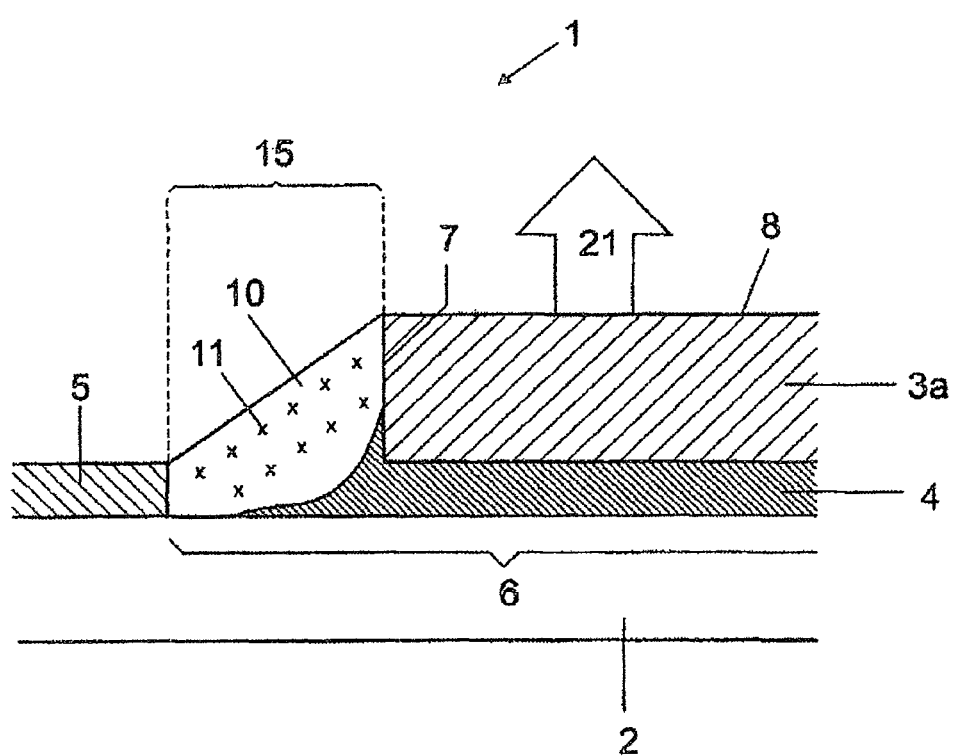
FIG. 1 shows in sectional view an excerpt from an electronic arrangement comprising an optoelectronic component.

FIG. 1 shows a section of an excerpt from an electronic arrangement 1. A connecting area 6 is arranged on a carrier 2. An optoelectronic component 3a is fixed on the connecting area 6 by means of a contact material 4. A covering area 5 surrounds the connecting area 6 on the carrier 2. A covered region 15 is covered by a covering material 10. The covering material 10 is designed in such a way that an optical contrast between the covering area 5 and the covered region 15 is minimized.

The connecting area 6 can be an electrical contact-making area. Alternatively, the connecting area 6 can also be an, in particular non-metallic, adhesive-bonding area.

The optical contrast is a color contrast and/or a brightness contrast.

The contact material 4 can be a solder or an adhesive. The optoelectronic component 3a can be an LED.

The covered region 15 comprises the side areas 7 of the optoelectronic component 3a, the regions of the connecting area 6 which are not covered by the optoelectronic component 3a, and the regions of the contact material 4 which are not covered by the optoelectronic component 3a. The area 8 of the optoelectronic component 3a which faces away from the carrier 2 has no covering material 10. The electromagnetic radiation 21 generated in the active zone is preferably emitted through the area 8 facing away from the carrier 2.

The covering area 5 can be a ceramic, preferably white, material. Alternatively or supplementarily thereto, the covering area 5 can be a laminated epoxy resin. Alternatively or supplementarily thereto, the covering area 5 can comprise soldering resist or a thermoplastic (premold package).

The covering material 10 can be a colored silicone. Alternatively or supplementarily thereto, the covering material 10 can be a colored epoxy resin, in particular soldering resist. Alternatively or supplementarily thereto, the covering material 10 can comprise a thermoplastic.

The covering material 10 can be colored by pigments 11, in particular by titanium dioxide ($TiO_2$) particles. The titanium dioxide particles are provided in the covering material up to a proportion of approximately 70 percent by weight, preferably of approximately 25 percent by weight.

The covering area 5 and/or the covering material (10) can be highly reflective. In this case, the respective reflectivities are greater than 70%.

Figure 2A:
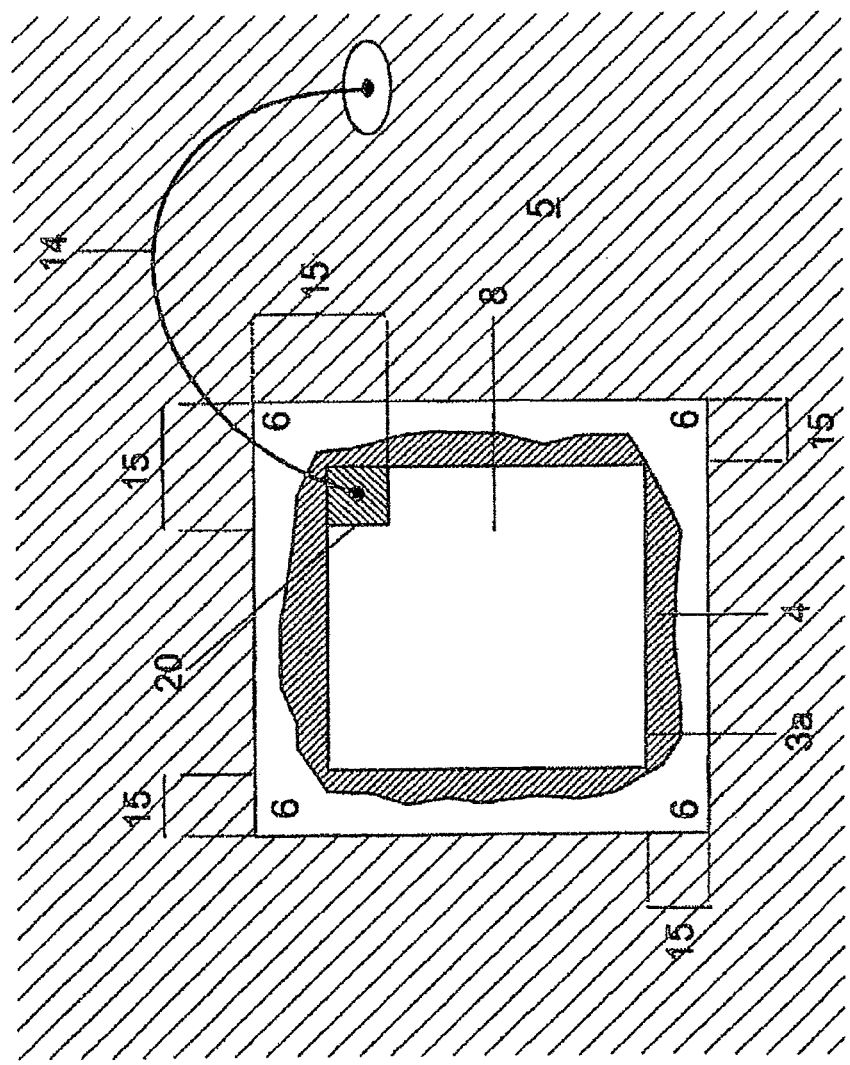
FIGS. 2a and 2b show plan views of an excerpt from an electronic arrangement comprising an optoelectronic component with wire contact-making.

FIG. 2a shows a plan view of an electronic arrangement before covering material 10 is applied. An optoelectronic component 3a is fixed on the connecting area 6 by means of a contact material 4. The optoelectronic component 3a is realized as a semiconductor chip with wire contact-making. The contact-making is effected via a bonding pad 20 on the optoelectronic component 3a by means of a bonding wire 14.

To the observer, contact material 4 is discernible around the optoelectronic component 3a on all sides. Contact material 4 is also discernible on the bonding pad 20 of the optoelectronic component 3a. The connecting area 6 is directly discernible between the regions with exposed contact material 4 and covering area 5. The contact material 4 and the connecting area 6 have dark coloration in comparison with the covering area 5 and stand out distinctly from the covering area 5 with regard to color and brightness. This dark coloration is aesthetically disturbing to the observer of an electronic arrangement 1 with an optoelectronic component 3a in the switched-off state. Moreover, the dark regions of the electronic arrangement 1 with an optoelectronic component 3a in the switched-on state lead to undesirable absorption losses. In order to solve or to reduce both problems, a covering material 10 is applied to the region 15 with exposed connecting area 6 and exposed contact material 4. The result can be seen in FIG. 2b.

Figure 2B:
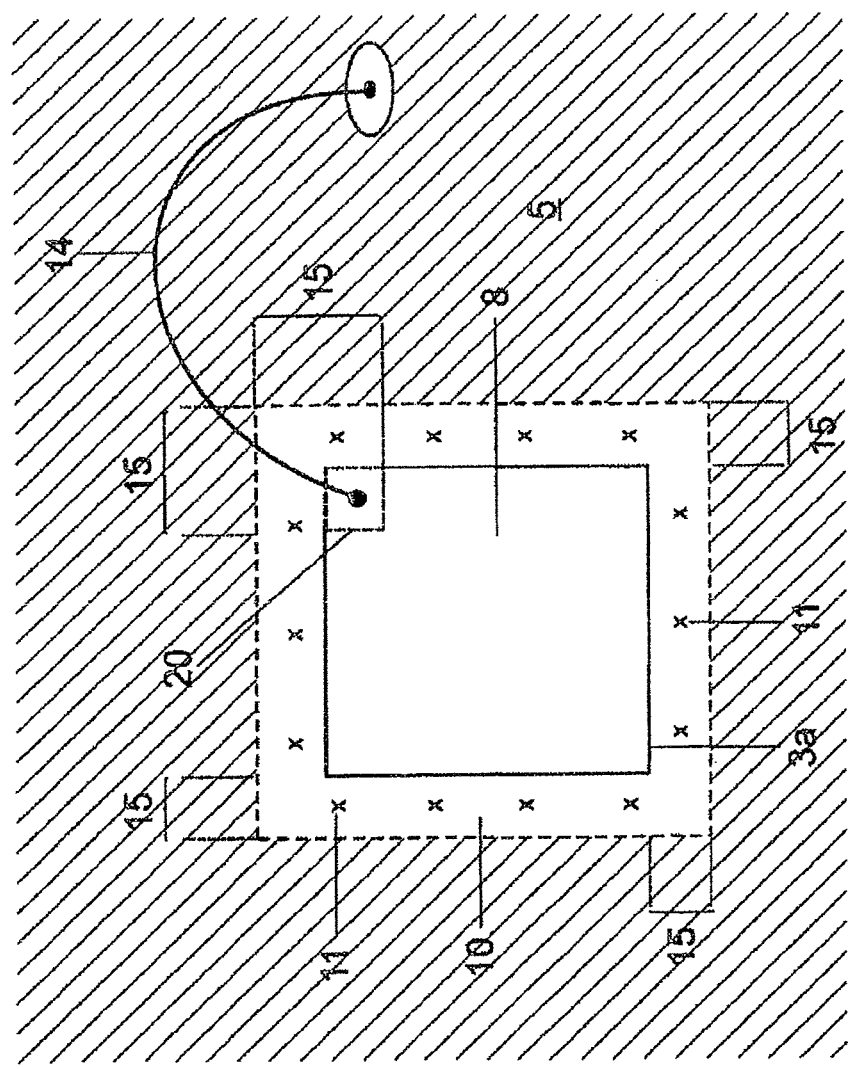

FIG. 2b shows a plan view of an electronic arrangement after covering material 10 has been applied. The region 15 is completely covered with covering material 10. The pigments 11 in the covering material 10 and the covering material 10 itself have the effect that the contrast between covered region 15 and covering area 5 disappears. Therefore, the boundary between covered region 15 and covering area 5 is depicted in a dashed manner. The area 8 of the optoelectronic component 3 which faces away from the carrier 2 has no covering material 10.

In an exemplary embodiment which is not shown, the bonding wire 14 is also covered with covering material 10.

FIG. 3a shows an electronic arrangement in which the optoelectronic component is configured as a flip-chip. The arrangement is identical to the arrangement in FIG. 2a, except that the bonding pad 20 and the bonding wire 14 from FIG. 2a are obviated in FIG. 2a. This is made possible by virtue of the fact that contact is made with the optoelectronic component 3a completely via the rear side of the optoelectronic component 3a.

FIG. 3b shows an electronic arrangement in which the optoelectronic component 3a is configured as a flip-chip and the exposed region between the optoelectronic component 3a and the covering area 5 is covered. The covered region 16 is covered by the covering material 10 in such a way as to result in a region between the semiconductor chip 3a having a luminous capability and the covering area 5, which region has a minimal contrast with respect to the covering area 5.

Figure 4:
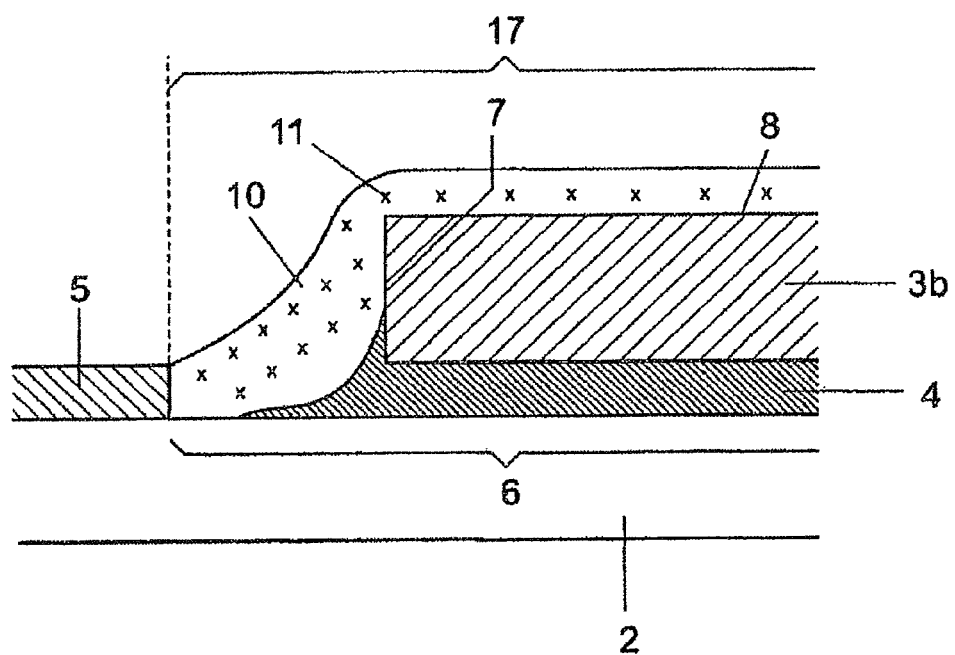
FIG. 4 shows in sectional view an excerpt from an electronic arrangement comprising a non-optoelectronic component.

FIG. 4 shows an electronic arrangement wherein the electronic component is a non-optoelectronic component 3b, in particular an ESD semiconductor chip and/or a microchip, for example a memory or a controller. Since the non-optoelectronic component 3b does not emit or sense electromagnetic radiation, the complete area 8 of the non-optoelectronic component 3b which faces away from the carrier 2 can be covered with covering material 10. As already shown in FIG. 1, in the case of a non-optoelectronic component 3b, too, the side areas 7 and the region with exposed contact material 4 and with exposed connecting area 6 can be covered with covering material 10. The covered region 17 with complete coverage of the non-optoelectronic component 3b leads to a homogeneous color impression and minimizes the absorption losses at the side areas 7 and at the area 8 of the non-optoelectronic component 3b which faces away from the carrier 2.

Figure 5:
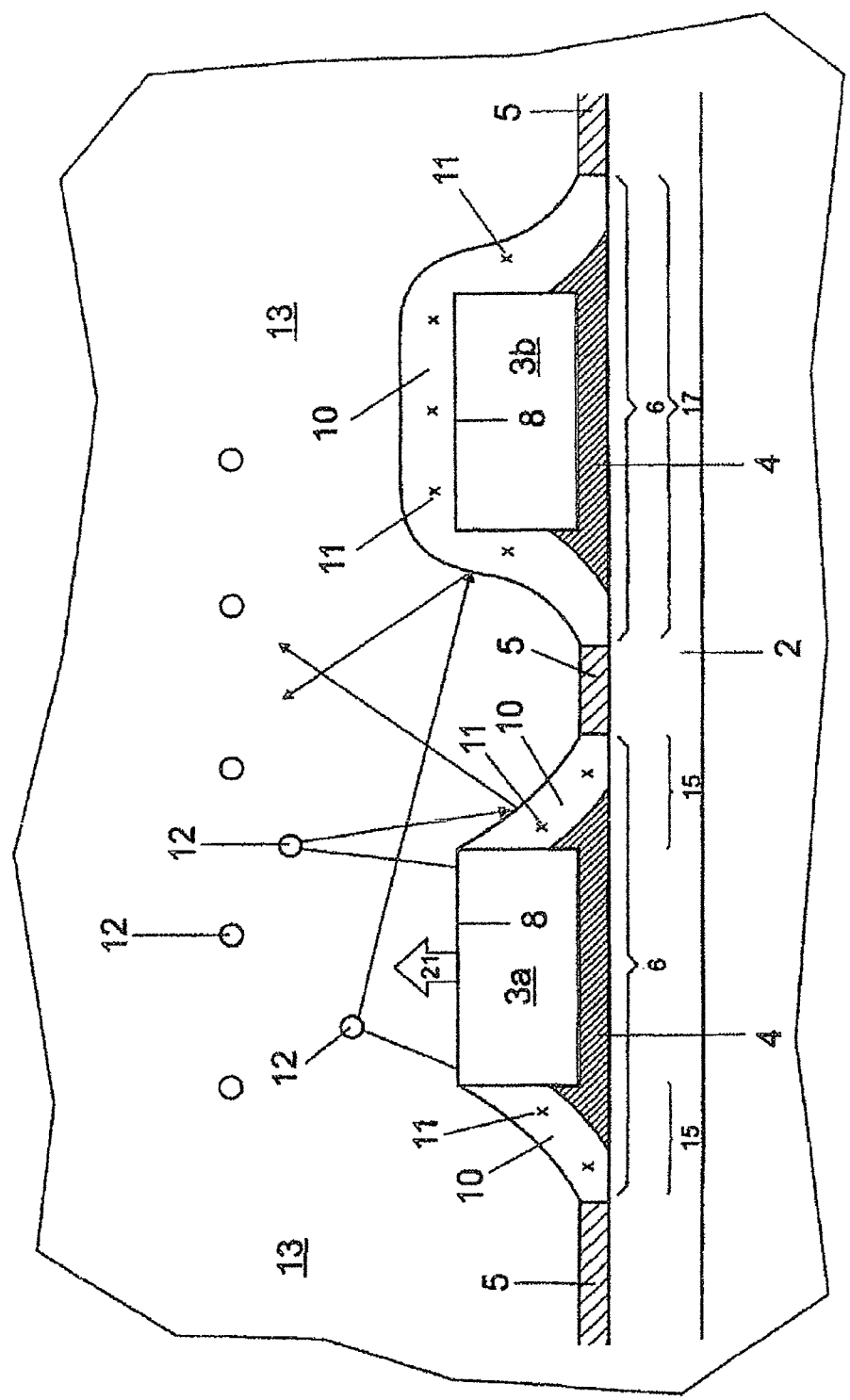
FIG. 5 shows in sectional view an excerpt from an electronic arrangement comprising an optoelectronic and a non-optoelectronic component.

FIG. 5 shows an electronic arrangement in which an optoelectronic component 3a and a non-optoelectronic component 3b are arranged in direct proximity to one another on a carrier 2. The covered region 15 in the case of the optoelectronic 3a and the covered region 17 with complete coverage of the non-optoelectronic component 3b are identical to those in FIG. 1 and FIG. 4. The electronic components 3a and 3b are potted with a potting material 13. Scattering centers 12 are introduced in the potting material 13. The complete covering 17 of the non-optoelectronic component 3b and the covered region 15 in the case of the optoelectronic component 3a reduces the undesired absorption losses. The electromagnetic radiation 21 emerging from the optoelectronic component 3a is scattered, in particular reflected, at the scattering sensors. The reflected radiation impinges for the most part on the covered regions 15 and 17 and the covering area 5. The covering material 10 and the covering area 5 are designed to be highly reflective. To a greater extent, the reflected electromagnetic radiation is absorbed only by the area 8 of the optoelectronic component 3a which faces away from the carrier 2.

FIG. 6a shows in sectional view an excerpt from an electronic arrangement, wherein the electronic component is an non-optoelectronic component 3c. In particular, the non-optoelectronic component 3c can be a passive component. In particular, a resistor, a capacitor or a coil can be provided as the passive component. A component having an SMD design is involved in the present case. In this case, the region 18 covered by the covering material 10 comprises the regions of the connecting area 6 which are not covered by the passive component 3c and the regions of the contact material 4 which are not covered by the passive component 3c. Between the SMD soldering connection areas 22 of the passive component 3c and the connecting areas 6, the contact material 4 imparts the electrical and mechanical connection. As was already the case in the previous figures, the covering area 5 surrounds the connecting areas 6. The area 8a of the passive component 3c which faces away from the carrier 2 remains uncovered.

FIG. 6b shows in plan view the excerpt from the electronic arrangement from FIG. 6a before exposed regions are covered by a covering material 10. As a result of the passive component 3c being fixed on the two connecting areas 6, contact material 4 is distributed beyond the boundary of the soldering connection areas 22. The optical impression is very inhomogeneous.

Figure 6C:
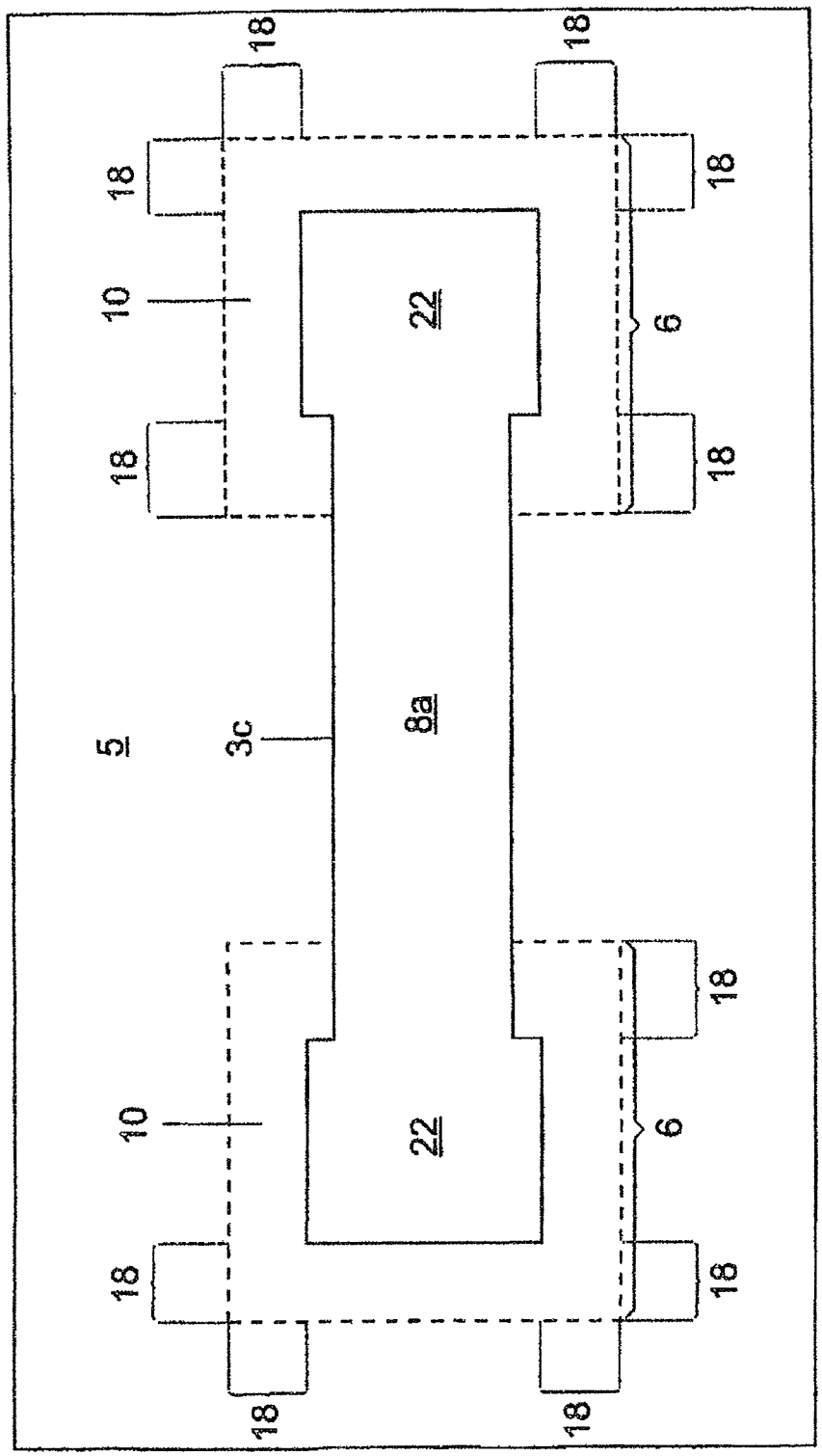

FIG. 6c shows the arrangement from FIG. 6b, wherein in FIG. 6c the exposed regions on the connecting area 6 and on the contact material 4 are covered with covering material 10. This results in a covered region 18. As already described in the previous exemplary embodiments, the optical contrast is reduced by the partial covering of exposed regions in the case of passive components 3c as well. The area 8a of the passive component 3c which faces away from the carrier 2 and the soldering connection areas 22 remain uncovered by covering material in the exemplary embodiment in FIG. 6c.

FIG. 7a shows in sectional view an excerpt from an electronic arrangement, wherein the electronic component, as already shown in FIG. 6a, is a passive component 3c. the contact material 4 directly adjoining the soldering connection areas 22 produces an electrical and mechanical contact between passive component 3c and the connecting areas 6. Solder is preferably used as contact material 4 for this function. Moreover, the contact material 4 imparts a purely mechanical contact between the area 8b of the passive component 3c which faces the carrier 2 and the carrier. An adhesive is preferably used as contact material 4 for this function. The covering material 10 covers the entire passive component 3c, the regions of the connecting areas 6 which are covered by the contact material 4, and the exposed regions of the connecting area 6. The covering material 10 is adjacent to the covering area 5 in a flush fashion. This results in a covered region 19 with complete coverage of the passive component 3c.

Figure 7B:
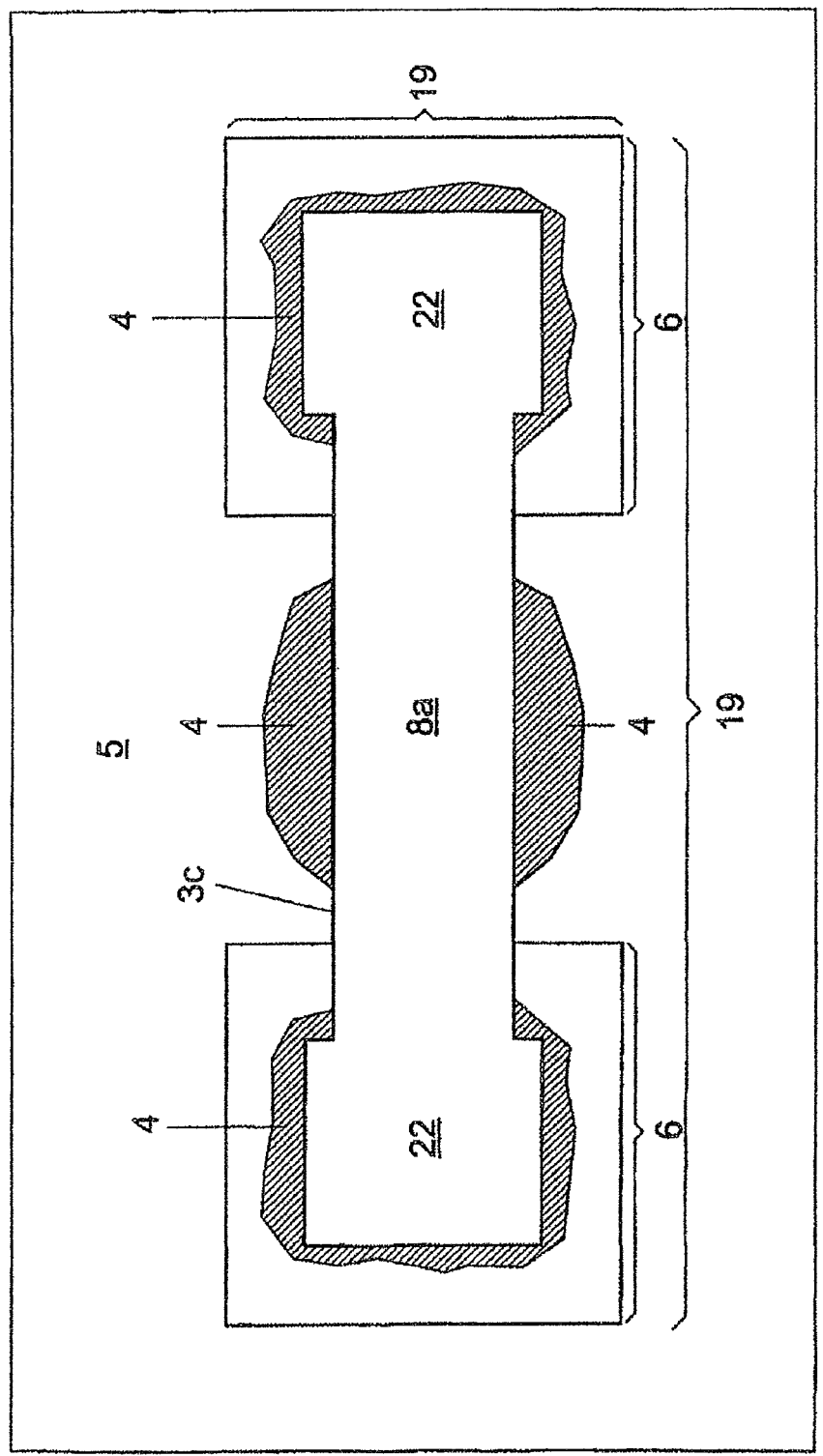
FIGS. 7b and 7c show in plan view an excerpt from an electronic arrangement comprising a non-optoelectronic component, in particular a passive component.

FIG. 7b shows in plan view the excerpt from the electronic arrangement from FIG. 7a before exposed regions are covered by a covering material 10. As a result of the passive component 3c being fixed on the two connecting areas 6, contact material 4 is distributed beyond the boundary of the soldering connection areas 22. Between the two soldering connection areas 22, additional contact material 4 is provided between the carrier 2 and the area 8b (in this respect see FIG. 7a; not visible in FIG. 7b) of the passive component 3c which faces the carrier 2. Said additional contact material 4 protrudes laterally below the passive component 3c. As a result of the exposed regions of the connecting areas 6 and of the contact material 4, the optical impression is very inhomogeneous and, in combination with optoelectronic components, absorption losses occur.

Figure 7C:
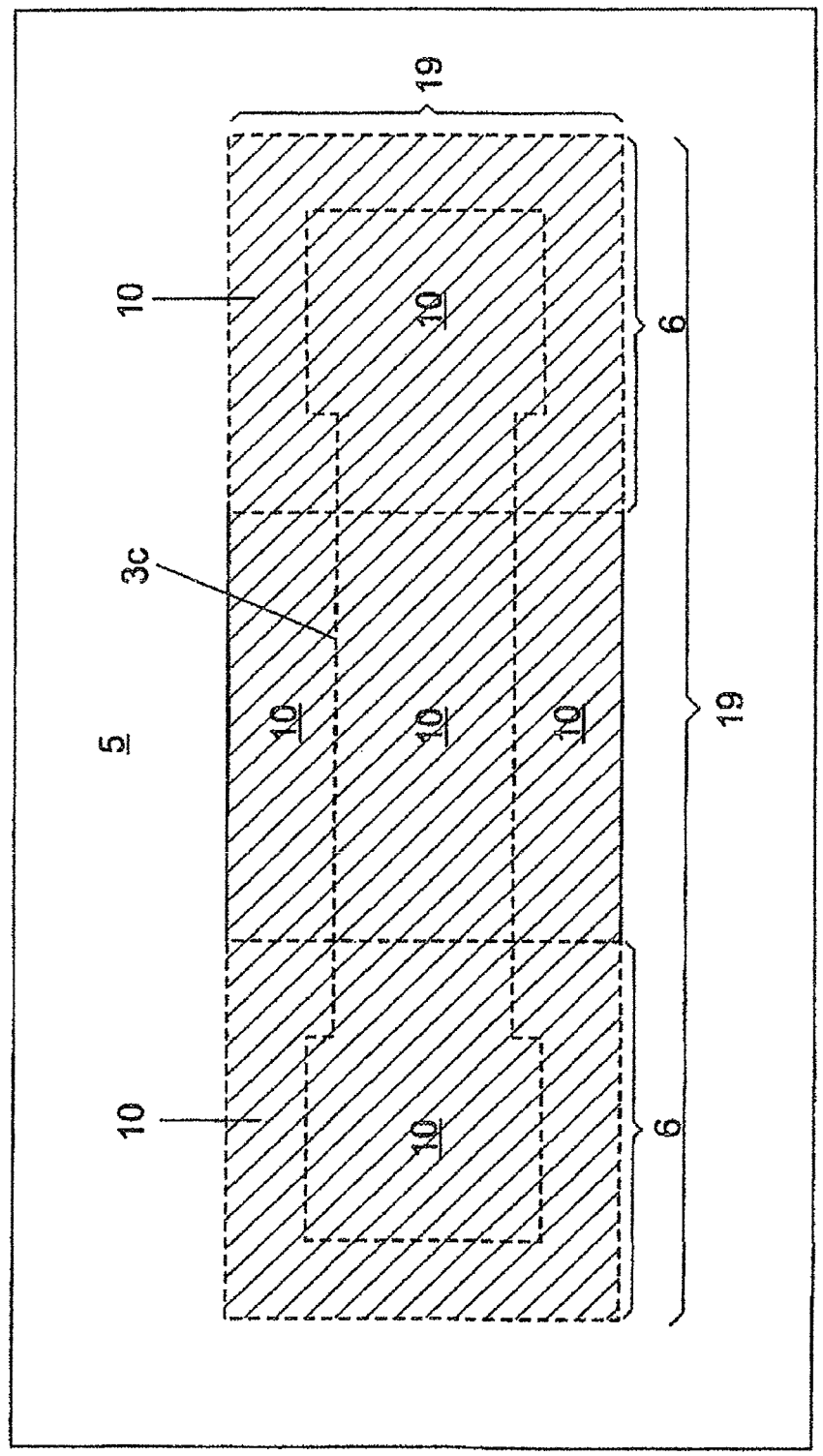

FIG. 7c shows in plan view the excerpt from the electronic arrangement from FIG. 7a, that is to say after exposed regions have been covered by a covering material 10. This results in a covered region 19 with complete coverage of the passive component 3c. The contrast between covering area 5 and covered region 19 is minimized; preferably, there is no longer any discernible contrast. The optical impression is very homogeneous. In order to indicate this, the structures of the passive component 3c which lie below the covered region 19 are illustrated in a dashed manner.

The electronic arrangement has been described on the basis of some exemplary embodiments in order to illustrate the underlying concept. In this case, the exemplary embodiments are not restricted to specific combinations of features. Even if some features and configurations have been described only in connection with one particular exemplary embodiment or individual exemplary embodiments, they can in each case be combined with other features from other exemplary embodiments. It is likewise conceivable, in exemplary embodiments, to omit or add individual presented features or particular configurations, insofar as the general technical teaching remains realized.

The invention claimed is:

1. An electronic arrangement comprising:
a carrier;
at least one connecting area on the carrier;
at least one electronic component, which is fixed at least on the connecting area by a contact material;
a covering area, which surrounds the connecting area on the carrier; and
at least one covered region covered by a covering material; wherein
the covering area is highly reflective with a reflectivity of greater than 70%,
exposed regions on the connecting area and on the contact material are covered with the covering material, and
the covering material is colored by titanium dioxide particles in such a way that the titanium dioxide particles are provided in the covering material in a proportion between 25 percent and 70 percent by weight, such that the covering material is highly reflective with a reflectivity of greater than 70% resulting in a minimizing of an optical contrast between the covering area and the covered region.

2. The electronic arrangement as claimed in claim 1, wherein the connecting area comprises an electrical contact-making area and/or an adhesive-bonding area.

3. The electronic arrangement as claimed in claim 1, wherein the optical contrast is a color contrast and/or a brightness contrast.

4. The electronic arrangement as claimed in claim 1, wherein the contact material comprises solder and/or an adhesive.

5. The electronic arrangement as claimed in claim 1, wherein the electronic component is an optoelectronic component.

6. The electronic arrangement as claimed in claim 1, wherein the electronic component is a non-optoelectronic component.

7. The electronic arrangement as claimed in claim 6, wherein the covered region comprises the area of the non-optoelectronic component which faces away from the carrier.

8. The electronic arrangement as claimed in claim 1, wherein the covered region comprises the side areas of the electronic component.

9. The electronic arrangement as claimed in claim 1, wherein the covered region comprises the regions of the connecting area which are not covered by the electrical component.

10. The electronic arrangement as claimed in claim 1, wherein the covered region comprises the regions of the contact material which are not covered by the electrical component.

11. The electronic arrangement as claimed in claim 1, wherein the covering area comprises a ceramic.

12. The electronic arrangement as claimed in claim 1, wherein the covering material comprises a colored silicone and/or at least one colored epoxy resin.

13. The electronic arrangement as claimed in claim 12, wherein the covering material is covered by pigments.

14. The electronic arrangement as claimed in claim 5, wherein the optoelectronic component is an LED.

15. The electronic arrangement as claimed in claim 6, wherein the non-optoelectronic component is an ESD semiconductor chip and/or a passive component.

16. The electronic arrangement as claimed in claim 11, wherein the ceramic is a laminated epoxy resin and/or soldering resist.

17. The electronic arrangement as claimed in claim 12, wherein the at least one colored epoxy resin is a soldering resist and/or thermoplastic.

18. An electronic arrangement comprising:
a carrier;
at least one connecting area on the carrier;
at least one electronic component, which is fixed at least on the connecting area by a contact material;
a covering area, which surrounds the connecting area on the carrier; and
at least one covered region covered by a covering material; wherein
the contact material has dark coloration in comparison with the covering area, the contact material comprises exposed regions which are not covered by the at least one electronic component, the covered region comprises the exposed regions of the contact material being not covered by the at least one electronic component and side areas of the at least one electronic component, the covering material is highly reflective with a reflectivity of greater than 70%, and the covering material covers the covered region so that an optical contrast between the covering area and the covered region is minimized.

19. The electronic arrangement as claimed in claim 18, wherein the contact material and the connecting area have dark coloration in comparison with the covering area and stand out distinctly from the covering area with regard to color and brightness.

20. The electronic arrangement as claimed in claim 18, wherein the covering area is highly reflective with a reflectivity of greater than 70%.

* * * * *